United States Patent
Lund et al.

(10) Patent No.: US 10,154,207 B2
(45) Date of Patent: Dec. 11, 2018

(54) EVENT-TRIGGERED IMAGING PIXELS

(71) Applicant: Sensors Unlimited, Inc., Princeton, NJ (US)

(72) Inventors: Joshua Lund, Dallas, TX (US); John Liobe, New York, NY (US)

(73) Assignee: Sensors Unlimited, Inc., Princeton, NJ (US)

( * ) Notice: Subject to any disclaimer, the term of this patent is extended or adjusted under 35 U.S.C. 154(b) by 0 days.

(21) Appl. No.: 15/426,521

(22) Filed: Feb. 7, 2017

(65) Prior Publication Data

US 2018/0227508 A1    Aug. 9, 2018

(51) Int. Cl.
| | |
|---|---|
| *H04N 5/00* | (2011.01) |
| *H04N 5/33* | (2006.01) |
| *H01L 27/146* | (2006.01) |
| *H04N 5/225* | (2006.01) |
| *H04N 13/214* | (2018.01) |

(52) U.S. Cl.
CPC ........... *H04N 5/33* (2013.01); *H01L 27/1463* (2013.01); *H01L 27/14612* (2013.01); *H01L 27/14649* (2013.01); *H04N 5/2256* (2013.01); *H04N 13/214* (2018.05)

(58) Field of Classification Search
CPC .. H01L 27/00; G01J 1/44; F41G 7/008; F41G 7/2253; F41G 7/2293; F41G 7/226; H04N 5/2256; H04N 5/33
See application file for complete search history.

(56) References Cited

U.S. PATENT DOCUMENTS

| | | | | |
|---|---|---|---|---|
| 6,040,568 | A  * | 3/2000 | Caulfield | ................. H04N 5/33 250/208.1 |
| 6,323,941 | B1 * | 11/2001 | Evans | ................... G01S 17/023 250/339.02 |
| 6,535,275 | B2 | 3/2003 | McCaffrey et al. | |
| 7,262,402 | B2 | 8/2007 | Niclass et al. | |
| 7,733,401 | B2 * | 6/2010 | Takeda | ................. H04N 5/2353 250/208.1 |
| 8,319,166 | B2 * | 11/2012 | Kawahito | ......... H01L 27/14609 250/208.1 |
| 8,581,168 | B2 * | 11/2013 | Linder | .................... F41G 7/008 250/208.1 |
| 8,780,240 | B2 | 7/2014 | Posch et al. | |
| 9,151,604 | B1 * | 10/2015 | Dunne | ..................... G01C 3/08 |
| 9,420,264 | B2 | 8/2016 | Gilliland et al. | |

(Continued)

OTHER PUBLICATIONS

Extended European Search Report dated Jun. 27, 2018 issued during the prosecution of European Patent Application No. EP 18155412.2 (10 pages).

*Primary Examiner* — Frank F Huang
(74) *Attorney, Agent, or Firm* — Locke Lord LLP; Scott D. Wofsy; Judy R. Naamat

(57) ABSTRACT

An imaging pixel includes a photodetector for generating a charge signal, an input buffer, a control device, and a switch. The input buffer is connected to the photodetector for amplifying the charge signal. The control device is connected to the photodetector and the input buffer to separate high-frequency charge signals from low frequency charge signals. The switch is operably connected to the input buffer for sampling of high-frequency charge signals in a charge storage device triggered by amplitude of high-frequency charge signals provided by the input buffer.

13 Claims, 4 Drawing Sheets

(56) References Cited

U.S. PATENT DOCUMENTS

| | | | |
|---|---|---|---|
| 9,435,891 B2 | 9/2016 | Oggier | |
| 9,484,377 B2* | 11/2016 | Won | H01L 27/14621 |
| 9,591,238 B2* | 3/2017 | Lee | H04N 5/3742 |
| 9,769,400 B2* | 9/2017 | Lin | H04N 5/357 |
| 9,810,777 B2* | 11/2017 | Williams | G01S 17/89 |
| 9,812,488 B2* | 11/2017 | Tsai | H01L 27/1464 |
| 9,838,636 B2* | 12/2017 | Tsuboi | H04N 5/37457 |
| 9,871,066 B2* | 1/2018 | Lin | H01L 27/14643 |
| 9,948,880 B2* | 4/2018 | Lund | H04N 5/2353 |
| 2002/0167589 A1* | 11/2002 | Schofield | B60N 2/002 |
| | | | 348/148 |
| 2004/0004707 A1* | 1/2004 | DeFlumere | F41G 3/06 |
| | | | 356/4.01 |
| 2004/0021766 A1* | 2/2004 | Daniilidis | H04N 5/2259 |
| | | | 348/36 |
| 2007/0038567 A1* | 2/2007 | Allaire | G06Q 30/0239 |
| | | | 705/50 |
| 2008/0272227 A1* | 11/2008 | Sharpe | F41G 7/226 |
| | | | 244/3.16 |
| 2009/0231432 A1* | 9/2009 | Grigsy | G08G 1/161 |
| | | | 348/149 |
| 2010/0284384 A1* | 11/2010 | Stahlin | H04W 76/40 |
| | | | 370/338 |
| 2010/0303048 A1* | 12/2010 | Stahlin | H04W 84/12 |
| | | | 370/338 |
| 2011/0098877 A1* | 4/2011 | Stahlin | G08G 1/161 |
| | | | 701/31.4 |
| 2011/0128902 A1* | 6/2011 | Guo | G08G 1/161 |
| | | | 370/312 |
| 2011/0177791 A1* | 7/2011 | Stahlin | B60R 25/102 |
| | | | 455/404.2 |
| 2011/0246594 A1* | 10/2011 | Cobbold | G06Q 10/10 |
| | | | 709/206 |
| 2012/0062743 A1* | 3/2012 | Lynam | B60Q 9/005 |
| | | | 348/148 |
| 2012/0248288 A1 | 10/2012 | Linder et al. | |
| 2013/0214158 A1* | 8/2013 | Kaufman | G01J 5/34 |
| | | | 250/338.1 |
| 2015/0325606 A1* | 11/2015 | Togashi | H04N 5/361 |
| | | | 250/208.1 |
| 2016/0003946 A1 | 1/2016 | Gilliland et al. | |
| 2016/0057366 A1 | 2/2016 | Lee et al. | |
| 2016/0295148 A1 | 10/2016 | Lin et al. | |
| 2016/0370226 A1 | 12/2016 | Lund | |

* cited by examiner

EVENT-TRIGGERED IMAGING PIXELS

BACKGROUND OF THE INVENTION

1. Field of the Invention

The present disclosure relates to sensing, and more particularly to systems and methods for sensing three-dimensional range and intensity data.

2. Description of Related Art

Range gating is an imaging technique commonly employed to gather range information of an object in a scene. The technique involves actively illuminating the scene with pulsed laser light and capturing an associated image using a very short exposure, generally by electronically controlling shutter duration with nanosecond precision, to obtain an image plane correlated to the laser pulse return time. Only objects in the image plane appear in the captured image and range to a given image plane is calculated based on the time interval between emission of the reflected laser pulse and acquisition of the image plane. Range gating is often used to image through obscurants, such as smoke or haze.

LiDAR, i.e., light imaging, detection, and ranging, is a type of sensing commonly employed for surveying a scene for purposes of making three-dimensional (3D) maps of the scene. LiDAR generally entails illuminating a scene using a pulsed illumination source and measuring the time of arrival of the pulsed illumination at pixels within a pixel array. The pixel array provides a return signal indicative of the arrival time of reflected illumination, arrival time of each pixel corresponding spatially to a range, or Z-distance, in the scene for 3D-mapping.

Such conventional methods and systems have generally been considered satisfactory for their intended purpose. However, there is still a need in the art for improved imaging systems and methods. The present disclosure provides a solution for this need.

SUMMARY OF THE INVENTION

An imaging pixel includes a photodetector for generating a charge signal, an input buffer, a control device, and a switch. The input buffer is connected to the photodetector for amplifying the charge signal. The control device is connected to the photodetector and the input buffer to separate high-frequency charge signals from low frequency charge signals. The switch is operably connected to the output of the input buffer for sampling of high-frequency charge signals in a charge storage device once an amplitude threshold of high-frequency charge signals provided by the input buffer is exceeded.

In certain embodiments, the input buffer can include an input terminal, a reference terminal, and an output terminal. The input terminal can be connected to the photodetector. The reference terminal can be connected to a reference voltage source to receive a reference signal therefrom for amplifying the charge signal. The output terminal can be connected to the control device and the switch. It is contemplated that the input buffer can be arranged to apply an amplified charge signal to the output terminal based on the charge signal and reference signal.

In accordance with certain embodiments, the photodetector can include a shortwave infrared photodiode. The control device can include a transistor with source, gate, and drain terminals. The source terminal can be connected to the photodetector. The gate terminal can be connected to the input buffer. The drain terminal can be connected to an integration capacitor for generating image data according to low-frequency charge signals from the photodetector.

It is contemplated that the switch can be dedicated to a single photodiode of the photodetector. The switch can have an input terminal and an output terminal. The switch input terminal can be connected to the input buffer to receive an amplified charge signal therefrom. The switch output terminal can be connected to the charge storage device to generate image data according to state of the switch.

It is also contemplated that, in accordance with certain embodiments, comparator can be connected between the input buffer and the switch to change state according to an amplified charge signal provided by the input buffer. The comparator can include an input terminal, a threshold terminal, and an output terminal. The input terminal can be connected to the input buffer to receive therefrom an amplified charge signal. The threshold terminal is connected to a trigger voltage source for comparing the amplified charge signal to a trigger voltage. The output terminal can be operably connected to the switch to change state of the switch according to a comparison of the amplified charge signal and the trigger voltage. The comparator circuit can be arranged to sample the amplified charge signal for a predetermined time interval subsequent to the amplified charge signal exceeding the trigger voltage.

An imaging device includes first and second imaging pixels as described above. The switch of the first imaging pixel is electrically isolated from the switch of the second imaging pixel for connecting to the charge storage device of the first imaging pixel independent of state of the second imaging pixel switch.

An imaging method includes receiving illumination at first and second photodetectors. A first charge signal is generated using the first photodetector. The first photodetector is connected to a first charge storage device based on the first charge signal. In certain embodiments, a second charge signal can be generated using the second photodetector. Connection of the first photodetector can be independent of connection of the second photodetector with a second photodetector. The second photodetector can be connected to the second charge storage device according to the second charge signal. Connection of the second photodetector can be synchronous or asynchronous of connection of the first photodetector.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION OF THE PREFERRED EMBODIMENTS

Figure 1:
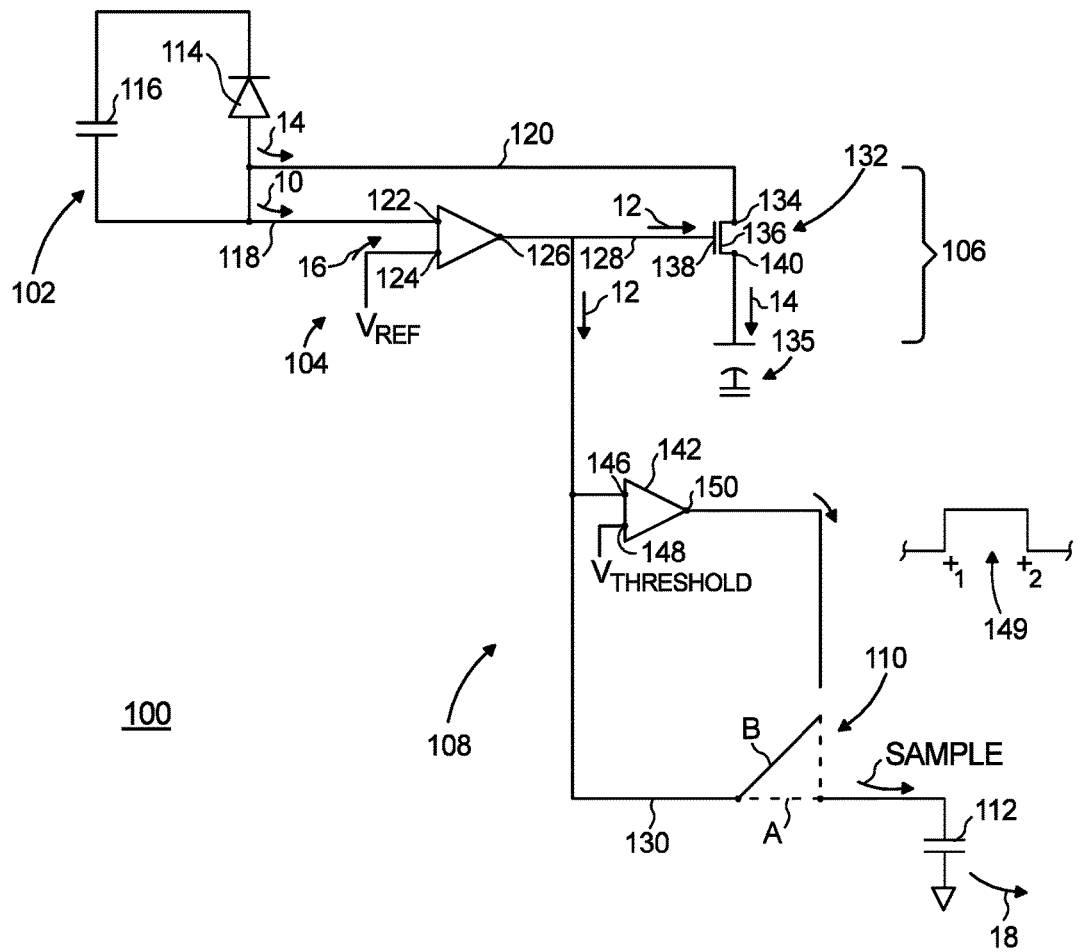
FIG. 1 is a circuit diagram of the an exemplary imaging pixel according to the present disclosure, showing a switch dedicated to a single photodetector.

Reference will now be made to the drawings wherein like reference numerals identify similar structural features or aspects of the subject disclosure. For purposes of explanation and illustration, and not limitation, a partial view of an exemplary embodiment of an imaging pixel in accordance with the disclosure is shown in FIG. 1 and is designated generally by reference character 100. Other embodiments of imaging pixels, imaging devices, and methods triggering imaging array in accordance with the disclosure, or aspects thereof, are provided in FIGS. 2-4, as will be described. The systems and methods described herein can be used for acquiring three-dimensional range information along with a high resolution image overlay, such as with shortwave infrared (SWIR) illumination, though the present disclosure is not limited to SWIR illumination or to coincident acquisition of range and imagery in generally.

Referring to FIG. 1, imaging pixel 100 is shown. Imaging pixel includes a photodetector 102 for generating a charge signal 10, an input buffer 104, a control device 106, and a sampling circuit 108 with a switch 110. Input buffer 104 is connected to photodetector 102 for amplifying charge signal 10. Control device 106 is connected to photodetector 102 and input buffer 104 for separating high-frequency charge signals 12 from low-frequency charge signals 14. Switch 110 is operably connected to input buffer 104 for sampling high-frequency charge signals in a charge storage device 112 triggered by amplitude of high-frequency charge signals provided by input buffer 104.

Photodetector 102 is arranged to detect an excitation signal 2, e.g., reflected illumination, and convert the excitation signal into electrical charge signal 10. In the illustrated exemplary embodiment photodetector 102 includes a photodiode 114 arranged to generate a current in response to SWIR illumination reflected by objects. A capacitance 116, which may be parasitic capacitance or a physical device, is arranged in parallel with photodiode 114 to convert the current into a voltage, which forms charge signal 10. Photodetector 102 is connected to input buffer 104 by buffer input lead 118 and to control device 106 by a control device input lead 120 for applying charge signal 10 to both input buffer 104 and control device 106. In certain embodiments photodiode 114 may be a single photodiode and switch 110 can be a single switch dedicated to photodiode 114 for capturing image data triggering recognition of an event based on charge signal 10, provided by photodiode 114. In accordance with certain embodiments, photodetector 102 can be arranged to generate charge signal 10 responsive to incident infrared light, such as light within a shortwave infrared (SWIR) waveband.

Input buffer 104 is a high-frequency amplifier and has an input terminal 122, a reference terminal 124, and an output terminal 126. Input terminal 122 is connected to photodetector 102 by buffer input lead 118. Reference terminal 124 is connected to a reference voltage source and receives therefrom a reference signal 16. Output terminal 126 is connected to control device 106 by a gate lead 128 and switch 110 by a switch input lead 130. It is contemplated that input buffer 104 can include an amplifier to amplify charge signal 10, received at input terminal 122, according to a comparison with reference signal 16, received at reference terminal 124. The amplified signal forms high-frequency signal 12, which is provided to switch input lead 130 and gate lead 128.

Control device 106 is a low-frequency diverting signal path and includes a transistor 132 and an integration capacitor 135. Transistor 132 has a source terminal 136, a gate 138, and a drain terminal 140. Source terminal 136 is connected to photodetector 102 through buffer input lead 118 to receive therethrough charge signal 10. Gate 138 is connected to output terminal 126 of input buffer 104 through gate lead 128 to receive therethrough high-frequency charge signal 12. Based on high-frequency charge signal 12, gate 138 selectively connects drain terminal 140 with source terminal 136, which allows charge signal 10 to enter integration capacitor 135 as low-frequency charge signal 14. As will be appreciated, low-frequency charge signal 14 can be provided as image data to imaging circuitry and/or software communicate with integration capacitor 135. This enables storing the charge signal when the first charge signal is a high-frequency charge signal by distinguishing, i.e., treating different, illumination according to whether it is low-frequency or high-frequency illumination. In the illustrated exemplary embodiment, direct injection transistor 134 is a p-type MOSFET otherwise referred to as a PMOS transistor.

Sampling circuit 108 includes switch 110, a comparator 142, and a charge storage device 144. Switch 110 has a closed state A and an open state B. In the open state B switch 110 is electrically open such that charge storage device 112 is electrically isolated from switch input lead 130 and high-frequency charge signal 12 does not propagate to charge storage device 112 for sampling. In the closed state B switch 110 is electrically closed. Closure of switch 110 places charge storage device 112 in electrical communication with switch input lead 130, and therethrough to output terminal 126 of input buffer 104, thereby allowing high-frequency charge signal 12 to propagate to and be sampled on charge storage device 112. As will be appreciated by those of skill in the art, the sampled charge forms image data 18 suitable for constructing imagery and/or providing ranging information.

Comparator 142 functions as an event detector and is operatively connected to switch 110 and arranged to control state of switch 110 according high-frequency charge signal 12. In this respect comparator 142 is connected between input buffer 104 and switch 110 to electrically close switch 110 upon detection of an event to the amplified high-frequency charge signal 12 provided by input buffer 104, the charge thereby flowing to charge storage device 112 by the closure of switch 110.

As shown in FIG. 1, comparator 142 has input terminal 146, a threshold terminal 148, and an output terminal 150. Input terminal 146 is connected to output terminal 126 of input buffer 104 to receive therefrom an amplified charge signal as high-frequency charge signal 12. Threshold terminal 148 is connected to a trigger voltage source for comparing the high-frequency charge signal 12 to a trigger voltage, which may be fixed or user-defined based on imaging conditions. Output terminal 150 is operably connected to switch 110 to change state of the switch according to a comparison of high-frequency charge signal 12 and the trigger voltage.

Comparator 142 can function to generate a fixed duration sample signal, e.g., with a predetermined time interval 149, at output terminal 150 in response to voltages applied input terminal 146 and threshold terminal 148. The fixed duration sample signal causes sampling of high-frequency charge signal 12 at charge storage device 112 for the predetermined time interval upon detection of an event by comparator 142. It is contemplated that comparator 142 and switch 110 be connected to a single photodetector, e.g., photodetector 102, for triggering acquisition of a single imaging pixel, e.g., imaging pixel 100, triggered by an event witnessed by the imaging pixel and independent of events reported by other imaging pixels within an imaging array.

Figure 2:
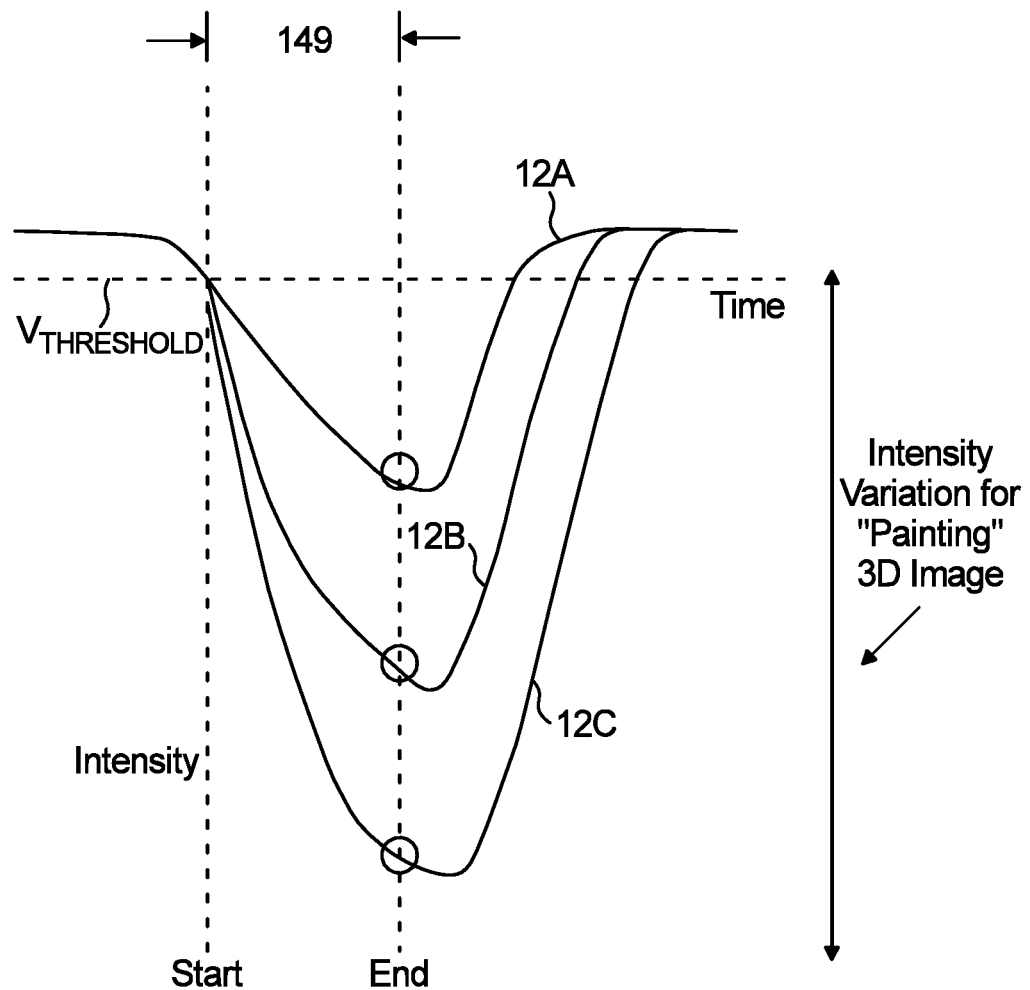
FIG. 2 is a chart of exemplary charge signals output from imaging device with a focal plane having the imaging pixels of FIG. 1, showing synchronous event detection acquiring additional information in a single exposure during ranging.

With reference to FIG. 2, exemplary high-frequency charge signals, i.e., high-frequency charge signals 12A-12C, with different peak intensities are shown. Each exemplary high-frequency charge signal 12A-12C exceeds a trigger threshold voltage, e.g., $V_{Threshold}$, has relative intensity that differs from the other, and is sampled during predetermined time interval 149. As will be appreciated by those of skill in the art in view of the present disclosure, the time elapsed between issue of a pulse from the pulsed illuminator and high-frequency charge signals 12A-12C exceeding the trigger threshold voltage provides an indication of the range of an object in spatial relation the pixels.

As will also be appreciated by those of skill in the art in view of the present disclosure, the use of a comparator to control the sampling of returned charge signals means that charge signals may arrive asynchronously at any time, and thus discrete pixels at different locations on a focal plane may be sampling return signals associated with different ranges within the same readout frame. Further, there is no need to control or gate an exposure window to synchronize to an image plane at a pre-determined range. As exposure is effectively triggered by the output of the comparator, discrete pixels may act asynchronously and sample individual charge return signals at different times associated with different ranges. The generated image is a capture of the first significant return at each pixel location, and may achieve 3D image data collection with a single illumination pulse and high signal to noise ratio. High signal to noise is achieved as the sampling window duration, or effective exposure window, is controlled by the bandwidth of input buffer 104 (shown in FIG. 1), comparator 142 (shown in FIG. 1), and sampling circuit 108 (shown in FIG. 1), which can be tuned for desired signal-to-noise ratio in a given imaging condition.

Figure 3:
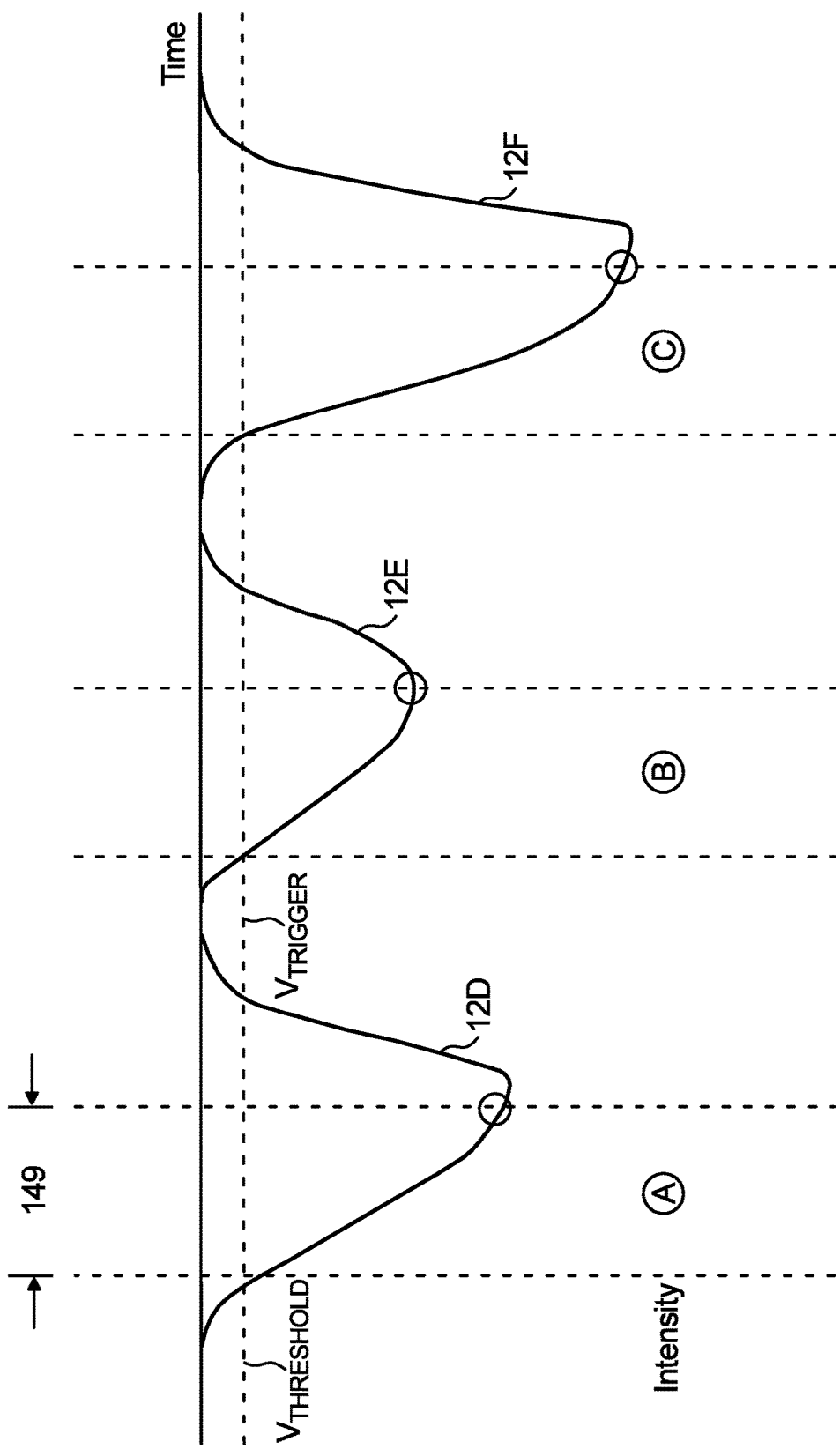
FIG. 3 is a chart exemplary charge signal over time in an imaging array including the imaging pixels of FIG. 1, showing pixel-specific event detections spaced apart in time.

With reference to FIG. 3, exemplary high-frequency charge signals, e.g., high-frequency charge signals 12D-12F, each having different peak intensities and each occurring at different times, are shown. Each exemplary high-frequency charge signal 12D-12F asynchronously exceed a trigger threshold voltage, e.g., $V_{Threshold}$, has relative intensity that differ from the others. Even though the return signal arrives at a different time in each imaging pixel, the independent event-triggering functionality provided by comparator 142 and switch 110 allows each to be sampled.

Figure 4:
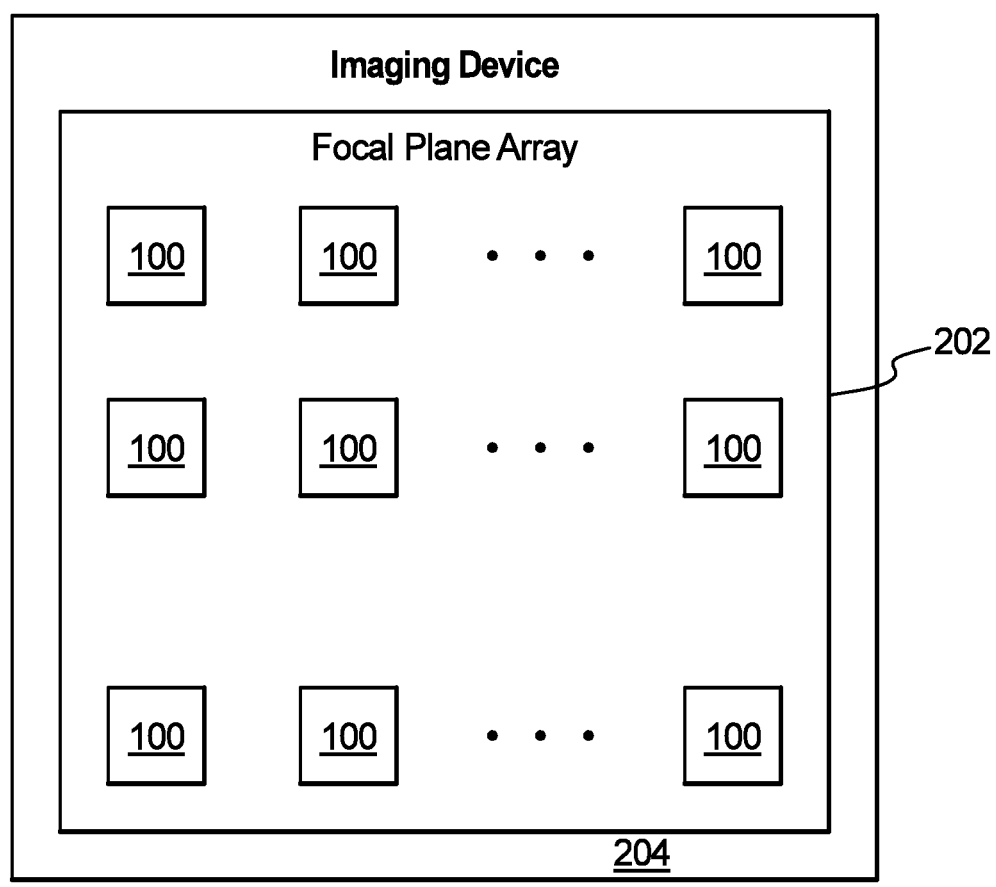
FIG. 4 is a diagram of an imaging device including the imaging pixel of FIG. 1, showing a focal plane array with a plurality of imaging pixels.

With reference to FIG. 4, an exemplary imaging device 200 is shown. Imaging device 200 includes a focal plane array 202, e.g., a readout integrated circuit (ROIC). Focal plane array 202 includes an array of imaging pixels 100 arranged on a substrate 204. Two or more of imaging pixels 100 are arranged for event triggering as described above, and suitable optics, row and column drivers, decoders, signal processing circuits, image processing circuits (not shown), and pulsed illuminator such as in a LiDAR system are provided for acquiring image data for creating 3D "painted" maps showing 3D range information along with high resolution image overlay. In certain embodiments, 3D "painted" maps can be acquired with a single exposure.

Range gating is an active illumination technique which can be used to see through obscurants to capture an image using a very short exposure that is correlated to an image plane illuminated with an active laser pulse at a specific moment time. It typically images only a single image plane at a time. LiDAR is an active imaging technique used to generate 3D maps which typically employs pulsed illumination and measures the time of arrival of the returning pulsed illumination on a pixel by pixel basis. The map is generally binary; a binary return signal is created where a time of arrival is determined when the received signal overcomes a threshold but no analog signal intensity is observed.

In embodiments described herein, imaging circuits are provided that perform event-triggered exposure. In certain embodiments, the imaging circuits, e.g., imaging pixel 100, includes an input photodetector, a high-frequency amplifier, a low-frequency signal diverting path, a comparator, and a sampling circuit. When a high-frequency pulse is received by the photodetector, charge representative of the received photocurrent accumulates at an input terminal of the amplifier, is amplified by the amplifier, and is compared by the comparator to a threshold. If the amplified signal associated with the charge exceeds a voltage threshold applied to the comparator an event is detected, a sample signal is generated, which closes a switch to sample the amplified signal, thereby detecting an event.

The methods and systems of the present disclosure, as described above and shown in the drawings, provide for imaging pixels, imaging devices, and imaging methods with superior properties including the capability to penetrate obscurant similar to range gating while simultaneously capturing additional relevant information about the obscured scene in a single exposure. In contemplated embodiments, imaging pixels, imaging devices, and imaging methods described herein can be used in conjunction with LiDAR to create "painted" 3D maps including 3D range information in conjunction with high resolution image overlay. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. An imaging pixel, comprising:
   a photodetector for generating a charge signal;
   an input buffer connected to the photodetector for amplifying the charge signal;
   a control device connected to the photodetector and the input buffer separating high-frequency charge signals from low-frequency charge signals;
   a switch operably connected to the input buffer for sampling of high-frequency charge signals in a charge storage device triggered by amplitude of high-frequency charge signals provided by the input buffer, wherein the switch has an input terminal and an output terminal, wherein the input terminal of the switch is connected to the input buffer to receive an amplified charge signal therefrom, wherein the output terminal of the switch is connected to a charge storage device to generate image data according to state of the switch; and
   a comparator having an input terminal, a threshold terminal, and an output terminal, wherein the input terminal is connected to the input buffer to receive therefrom an amplified charge signal, wherein the threshold terminal is connected to a trigger voltage source, and wherein the output terminal is operably connected to the switch to change state of the switch according to a comparison of the amplified charge signal and a trigger voltage signal received from the trigger voltage source, the comparison generating a sample signal, which closes the switch to generate the amplified signal, thereby detecting an event.

2. The pixel as recited in claim 1, wherein the switch is dedicated to a single photodiode of the photodetector.

3. The pixel as recited in claim 1, wherein the photodetector is a shortwave infrared pixel.

4. The pixel as recited in claim 1, further comprising a comparator connected between the input buffer and the switch to change a state of the switch according to an amplified charge signal provided by the input buffer.

5. The pixel as recited in claim 1, wherein the input buffer includes an input terminal, a reference terminal, and an output terminal, wherein the input terminal is connected to the photodetector to receive a charge signal therefrom, wherein the reference terminal is connected to a reference voltage source to receive a reference signal therefrom, and wherein the input buffer is arranged to apply an amplified charge signal to the output terminal based on the charge signal and reference signal.

6. The pixel as recited in claim 1, wherein the control device includes a transistor with a gate terminal, wherein the gate terminal is connected to the input buffer.

7. The pixel as recited in claim 6, wherein the transistor includes a source terminal, wherein the source terminal is connected to the photodetector.

8. The pixel as recited in claim 6, wherein the transistor includes a drain terminal, wherein the drain terminal is connected to an integration capacitor for generating image data according to low-frequency charge signals received from the photodetector.

9. An imaging device, comprising:

a first imaging pixel as recited in claim 1; and a second imaging pixel also as recited in claim 1, the switch of the first imaging pixel being electrically isolated from the switch of the second imaging pixel for connection to the charge storage device of the first imaging pixel independent of state of the second imaging pixel switch.

10. The imaging device as recited in claim 9, wherein each switch is dedicated to a single photodiode of the imaging pixel photodetector.

11. The imaging device as recited in claim 9, wherein the each switch has an input terminal and an output terminal, wherein the respective switch input terminals connect to the input buffer to receive an amplified charge signal from the respective imaging pixel input buffer, wherein respective output terminals of the switches connect to respective charge storage devices of the respective imaging pixels generate image data according to state of the respective switch.

12. The imaging device as recited in claim 9, wherein each imaging pixel includes a comparator connected between the input buffer and the switch to change a state of the switch according to an amplified charge signal provided by the input buffer of the imaging pixel.

13. The imaging device as recited in claim 12, wherein each comparator has an input terminal, a threshold terminal, and an output terminal, wherein the input terminal is connected to the input buffer to receive therefrom an amplified charge signal, wherein the threshold terminal is connected to a trigger voltage source, and wherein the output terminal is operably connected to the switch to change state of the switch according to a comparison of the amplified charge signal and a trigger voltage signal received from the trigger voltage source.

* * * * *